US000001210H

United States Statutory Invention Registration [19]

[11] Reg. Number: H1210

Jansen

[43] Published: Jul. 6, 1993

[54] SURFACE HARDENING OF REPROGRAPHIC MACHINE COMPONENTS BY COATING OR TREATMENT PROCESSES

[76] Inventor: Frank Jansen, 301 Maidstone Dr., New York, N.Y. 14580

[21] Appl. No.: 504,224

[22] Filed: Apr. 4, 1990

[51] Int. Cl.[5] ..... C23C 16/00
[52] U.S. Cl. ..... 427/249; 427/399
[58] Field of Search ..... 427/39, 249, 38, 318

[56] References Cited

U.S. PATENT DOCUMENTS 3,959,557 5/1976 Berry ..... 427/249 X

OTHER PUBLICATIONS

"Wear Properties of Tetrahedrally Bonded Amorphous Thin Films", Thin Solid Films, 140 (1986) 227–235, F. Jansen and M. A. Machonkin.

"Plasma Deposited Thin Films", Chap. 4—Carbon Thin Films, John C. Angus et al., Edited by J. Mort and F. Jansen.

"A Diamond-Like Carbon Film", RCA Review, vol. 43, Dec. 1982, 665–674 Joseph Zelez.

*Primary Examiner*—Bernarr E. Gregory

[57] ABSTRACT

A process for maximizing wear resistance of electrophotographic components which comprises coating the components with a diamond-like amorphous carbon material, a titanium compound, or mixtures thereof.

14 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SURFACE HARDENING OF REPROGRAPHIC MACHINE COMPONENTS BY COATING OR TREATMENT PROCESSES

BACKGROUND OF THE INVENTION

This invention is generally directed to coating and treatment processes, and more specifically to the coating and surface hardening treatment of various components in an electrophotographic imaging or printing apparatus. More specifically, the present invention is directed to the coating and surface hardening treatment, that is for example casing the surface by nitriding or carbiding, of paper guides, registration edge components, and the like in electrophotographic imaging or printing apparatus, which coatings or treatments render these components abrasion resistant. In one embodiment of the present invention, the coating selected is comprised of diamond-like carbon. In another embodiment of the present invention, the reprographic component such as the paper guidance device is coated with titanium nitride, titanium carbide or a similar hard coating. Also, in another embodiment of the present invention the reprographic component such as the paper guidance device can be treated by standard metallurgical techniques such as carbiding or nitriding to acquire a hard surface layer.

Many of the components in electrophotographic imaging and printing apparatuses are subject to wear, especially after extended usage. For example, in xerographic imaging and printing systems, paper guides and registration edge components in document handlers, on the platen table, and the like are subject to undesirable abrasion since, for example, the paper used for the generation of images contains abrasive materials, such as aluminum oxides, which cause undesirable grooves in the paper guidance components. To enable paper to travel reliably from an input to an output tray in a reprographic machine, including xerographic imaging and printing apparatuses, guides are needed and these guides are in physical contact with abrasive papers whereby a groove is formed in the guide which can result in paper retention and jamming of the machine. The aforementioned problems and others are avoided or minimized with the processes and products of the present invention.

DESCRIPTION OF THE DRAWINGS

Illustrated in FIG. 1 is a view of a PECVD system that can be utilized for the processes of the present invention.

SUMMARY OF THE INVENTION

Figure 1:
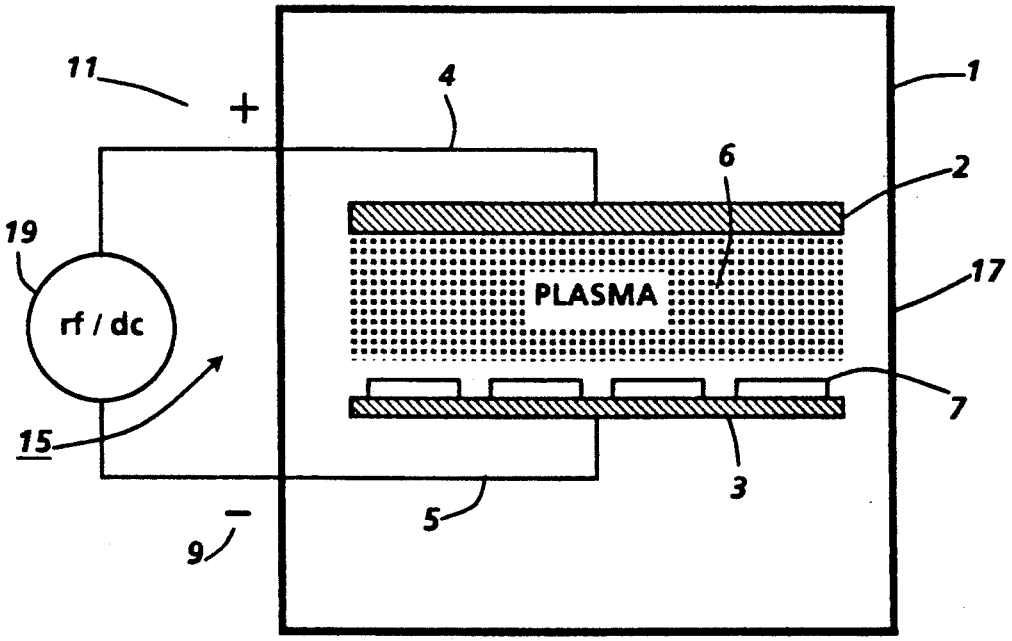

It is an object of the present invention to provide products and processes for eliminating and/or minimizing abrasion of many of the components present in electrophotographic imaging and printing processes.

In yet another object of the present invention there are provided processes wherein components subject to abrasion and wear are coated with diamond-like amorphous carbon, with titanium nitride or with titanium carbide, or wherein the components are treated with metallurgical methods such as nitriding or carbiding to enable the generation of a hard surface layer.

Also, in a further object of the present invention there are provided processes wherein diamond-like carbon, titanium nitride or titanium carbide, or metallurgical methods such as nitriding or carbiding, can be selected as a coating or treatment to avoid or minimize wear of reprographic components such as paper guides, registration edge system components and the like.

Further, in another object of the present invention there are provided processes wherein paper guides, registration edge system components, and the like, present in xerographic imaging and printing machines, are coated with diamond-like amorphous carbon, with titanium nitride or with titanium carbide, or treated by metallurgical methods such as nitriding or carbiding to acquire a hard surface layer.

These and other objects of the present invention are accomplished by the provision of coated components or surface hardened components. More specifically, in accordance with the present invention, in one embodiment there are provided processes for eliminating and/or minimizing wear and/or abrasion of many of the components present in electrophotographic imaging and printing processes by effecting the coating thereof with diamond-like amorphous carbon, titanium nitride or titanium carbide. In another embodiment of the present invention, there are provided processes for eliminating and/or minimizing wear and abrasion of many of the components, for example, those containing steel present in electrophotographic imaging and printing processes by effecting the surface hardening thereof with metallurgical methods, such as nitriding or carbiding, and wherein, for example, there is enabled the incorporation of carbon or nitrogen in effective amounts of, for example, from about 0.01 percent by weight to about 10 percent by weight as a thin surface layer of the steel with a coating thickness from about 10 nanometers to 10 micrometers, rendering this surface abrasion resistant.

Further, in another embodiment of the present invention there are provided processes wherein paper guides, registration edge system components, and the like, present in xerographic imaging and printing machines, are coated with hard amorphous carbon, titanium nitride or titanium carbide or surface hardened by incorporation of nitrogen or carbon in the surface for the primary purpose of eliminating or minimizing abrasion.

In other embodiments of the present invention, there is provided a process for maximizing resistance to mechanical wear of electrophotographic components which comprises coating the components with a diamond-like amorphous carbon material, a titanium compound, or mixtures thereof; a process for avoiding wear or maximizing abrasion resistance of paper guide components present in an electrophotographic apparatus which comprises coating the components with diamond-like amorphous carbon, a titanium compound, or mixtures thereof; a process for avoiding wear or maximizing abrasion resistance of registration edge guides present in an electrophotographic apparatus which comprises coating the guides with diamond-like material, a titanium compound, or mixtures thereof; a process for avoiding wear or maximizing abrasion resistance of paper guide components present in an electrophotographic apparatus which comprises chemically modifying the surface of the component by nitriding or carbiding; an abrasion resistant paper guide for an electrophotographic imaging system which guide contains steel and a coating thereover of a diamond-like amorphous carbon material, a titanium compound, or mixtures thereof; an abrasion resistant registration edge device for an electrophotographic imaging system which guide contains steel and a coating thereover of a diamond-like amorphous carbon material, a titanium compound, or mixtures thereof; an abrasion resistant paper guide for an electrophotographic imaging system, which guide is comprised of steel treated by nitrating or carbiding; and an abrasion resistant registration edge device for an electrophotographic imaging system which edge contains steel treated by nitrating or carbiding. Moreover, in another embodiment of the present invention the coatings indicated herein might be applied to an insert component that might be clipped, for example, to the guidance structure.

One specific coating selected for the process of the present invention is a hard, amorphous carbon also known as diamond-like carbon. An overview illustrating the deposition of carbon films is described by John C. Angus in Chapter 5 of the book *Plasma Deposited Films,* edited by J. Mort and F. Jansen and published in 1986 by CRC Press in Boca Raton, Florida, the disclosure of which is totally incorporated herein by reference. Carbon films with diamond-like properties are very hard and typically have a coefficient of friction which is typically smaller than 0.2, according to the aforementioned book. These properties render this material a preferred material for the mechanical protection of paper guidance components in reprographic machinery such as copiers and printers. One factor in depositing dense and hard amorphous carbon films, as opposed to graphitic carbon films which are relatively soft, is to bombard the surface of the film during growth with energetic ions or atoms. Although it is not desired to be limited by theory, one might conjecture that the bombardment prevents the formation of extended graphitic regions and promotes the amorphous nature and random bonding in the solid. Although many other deposition techniques have been reported, these films are generally deposited by either the known sputtering technique or by the known technique of plasma enhanced chemical vapor deposition (PECVD). The diamond-like properties are imparted to the material during the fabrication process by randomizing the bonding structure. This can be accomplished by bombarding the surface of the growing film with energetic particles such as ions. In such a fashion, a material is obtained that is neither graphite nor diamond but that can be viewed as a highly crosslinked graphitic material or alternatively as a very imperfect diamond structure. Methods for deposition of films with these desirable properties include sputtering of graphite targets under conditions of ion bombardment and also the plasma enhanced chemical vapor deposition (PECVD) of hydrocarbon or fluorocarbon gases, or mixtures thereof, under conditions of ion bombardment as described, for instance, in the aforementioned Angus book. Hydrogen and/or halogen, such as fluorine, at concentrations of from about 1 to 60 atomic percent, preferably of from 5 to 20 percent, and more preferably at concentrations of from about 3 to 10 percent, can be incorporated in the material when PECVD is used as the deposition technique for the diamond-like carbon films.

Another class of specific coatings selected for the process of the present invention is the refractory metal nitrides and carbides of which titanium nitride and titanium carbide are well known industrial examples. The deposition of these compounds by reactive sputtering or chemical vapor deposition is well known in the scientific and technical literature and extensively practiced for the purpose of tool coating, and in Werner Kern, Chapter III-2, *Chemical Vapor Deposition of Inorganic Films in Thin Film Processes,* edited by John L. Vossen and Werner Kern, published by the Academic Press, 1978, NY; in the scientific literature such as D. Kim and coworkers in *Thin Solid Films,* volume 165, pages 149–161, 1988 and references contained therein; or M. J. Vasile and coworkers, *Journal of Vacuum Science and Technology,* volume 8A, issue number 1, page 99, 1990 and references contained therein, the disclosures of all the aforementioned literature and references being totally incorporated herein by reference. Drill bits and mill ends are examples of machining tools that last longer when coated with titanium compounds. An example of an overview of these methods and their industrial applications can be found in the trade literature published by companies such as Multi-Arc Scientific Coatings with Corporate Offices in St. Paul, Minnesota, Vac-Tec Systems, Inc. with Corporate Offices in Boulder, Colorado or Interatom GmbH with Corporate Offices in Bergisch Gladbach, West Germany, the disclosures of which are totally incorporated herein by reference. One preferred method of coating is the chemical vapor deposition (CVD) rather than the physical vapor deposition (PVD) method since, for example, the CVD coatings are usually conformal, that is the coating uniformly covers the component without the need to rotate the component during the deposition of the material. This could be of importance for the present application as most paper guidance components have nonplanar and intricate shapes. The basis of the CVD method is the thermal decomposition of gas mixtures of titanium and carbon- or/and nitrogen-containing vapors at the surface of the component. Thus, one part of titanium tetrachloride and from 0.1 to 10 parts of methane or ammonia, or 10 to 100 parts of nitrogen are introduced in deposition reactors at atmospheric pressure, which reactors contain the component, such as the paper guide, to be coated. Flow rates are from about 100 sccm (standard cubic centimeters per minute) to 10 slm (standard liters per minute) and preferably from about 200 sccm to about 2 slm for medium sized reactors where the reactor volume is smaller than 10 liters. The temperature of the components is maintained at 850° C. Due to these high temperatures of deposition the amounts of chlorine and hydrogen incorporated in the coating, such as titanium nitride, is usually less than about 5 weight percent and preferably from about 1 to about 3 weight percent.

Also, in another embodiment of the present invention a variety of metallurgical treatments can be selected to transform or modify the surface of the component, such as the paper guidance device, into a very hard surface layer. It is known in the art of metallurgy that the incorporation of small amounts of nitrogen and/or carbon in the surface layer of steel renders this layer very hard and resistant to mechanical abrasion. Since this kind of conformal surface treatment is akin to forming a hard case around the workpiece, these metallurgical treatment methods are also known as 'casing'. Specifically, nitrogen and carbon can be incorporated in the surface layer by heating the components to about 500° to about 600° C. in an atmosphere of, for example, ammonia or methane. These gases are introduced into the furnace which contains the component, such as the paper guidance parts, to be coated at atmospheric pressure for an effective time period of about, for example, 10 hours in an embodiment of the present invention at flow rates of typically from about 100 sccm to about 1 slm. There is no scaling formed at the surface of the components thus the parts may be finished to size and then surface hardened as the final treatment. Particularly suitable for hardening are the low carbon sheet steels that are especially formulated for the deep drawing forming process. These sheet steels often contain small amounts of aluminum to retard the aging of the steel and these steels are commercially referred to as draw quality aluminum killed steels. Upon nitriding, surface hardness values of up to 1,200 Brinell have been measured. These and other methods are well known and described in metallurgical textbooks on heat treatment methods, such as steel and its heat treatment, *Bofors Handbook* by Karl-Erik Thelning, published by Butterworths in London and Boston in 1975, or also *Principles of Heat Treatment* by M. A. Grossman and E. C. Bain, published by the American Society for Metals in 1935, the disclosures of which are totally incorporated herein by reference.

In a revolving document handler the paper has to make several 180° turns in order to move from the bottom of the paperstack to the top of the transparent glass or platen where it is exposed and photocopied. After photocopying, the paper is transported back to the top of the paper stack. If double sided copying is required, the paper is turned around in the document handler. All these manipulations require the substantial perfect positioning of the paper at the moment of photocopying on top of the platen. This positioning is made possible by paper registration guides which are placed in the document handler to guide the paper at critical portions of its tortuous path. The guide forces the paper in position when it makes contact with the paper and the paper rubs against the guide. Due to the high volume of copying and the relatively high force at which the paper is forced against the registration guide, the guides in revolving document handlers are particularly prone to mechanical abrasion. The 180° turn part is basically a groove in the shape of a half moon. The groove is obtained by deep drawing the part from sheet meta. To avoid grooves, with the processes of the present invention in an embodiment thereof, diamond-like carbon is deposited therein by known PECVD methods as mentioned herein. The parts to be coated can be incorporated in the substrate holder of a plasma deposition apparatus, and the apparatus is evacuated. A predetermined flow of a mixture of argon and acetylene is introduced into the reactor and the vacuum pumps are throttled to establish a predetermined pressure. Direct current electrical power is applied to the substrate holder and parts. The counterelectrode in the plasma reactor is water cooled and grounded. Electrical power is applied to the substrate holder and a plasma is established in the region between the electrodes. The precursor gases decompose in the plasma and the decomposition products condense by chemical reaction on the substrate. By continuing the process for a predetermined amount of time, a thin film of carbonaceous material is formed on the substrate part which can be a paper registration guide. The process is terminated by discontinuing the electrical power and the flow of gases, and by venting the vacuum system and removing the parts for further assembly. The specific process parameters and the like are known, reference for example the John C. Angus book mentioned herein.

Also, titanium nitride or titanium carbide films can be deposited in the aforementioned groove by CVD. In one embodiment of the present invention, the part to be coated is placed on a substrate plate of a CVD reactor. The apparatus is evacuated and heated to a suitably high temperature. A predetermined flow of a mixture of nitrogen and titanium tetrachloride is introduced into the reactor and the vacuum pumps are throttled to establish a predetermined pressure. The precursor gases decompose by contact with the hot substrate and the decomposition products condense by chemical reaction on the substrate. By continuing the process for a predetermined amount of time, a thin film of titanium nitride is formed on the substrate paper registration guide. The process is terminated by discontinuing the electrical power and the flow of gases by venting the vacuum system and removing the parts for further assembly. Grooves can be avoided by accomplishing the aforementioned coating prior to use of the components, such as the paper registration guide. Other electrophotographic components can be coated and/or treated as illustrated herein.

Amorphous carbon is known, see for example *Thin Solid Films* 140,227, 1986, Frank Jansen and M. A. Machonkin, and moreover typically measured values of the coefficient of friction for the film/film coefficient of certain amorphous carbons, which are of about 0.2, are illustrated in Chapter 4 of *Plasma Deposited Thin Films,* John Angus, CRC Press (1986). The selection of amorphous carbon films on sewing machine bobbins is disclosed in *RCA Review,* 43,665, (1982), J. Zelez.

The following examples are being supplied to further define various species of the present invention, it being noted that these examples are intended to illustrate and not limit the scope of the present invention. Parts and percentages are by weight unless otherwise indicated.

EXAMPLE I

Steel registration edge paper guides as obtained from Alliance Metal Stamping and Fabricating of Rochester, NY, a component of a Xerox Corporation 5090 TM imaging apparatus document handling system, were coated with diamond-like carbon as follows. The guides were incorporated in a deposition vacuum system of the type that is known as a PECVD system as illustrated in the following Figure wherein The square box 1 designates the vacuum chamber with two electrodes 2 and 3, connected by wires 4 and 5, with components 7 the part to be coated on electrode 3. The bottom electrode 3 is connected to the negative electrical power source 9 and the top electrode is connected to the positive power source 11, which is generally electrically grounded. The electrical power supply may be a dc or an rf gas inlet. Pump connections are not shown, 15 and 17 can be inlets and outlets to the vacuum chamber, 6 represents the plasma, and 19 the electrical power supply.

Four of the paper guides 7 to be coated were placed on the cathodic electrode 3, that is the electrode that assumes a negative bias with respect to the plasma which is present during the deposition of the diamond-like film on this part. A gas mixture of 10 parts of argon and 1 part of acetylene was introduced through a shower head arrangement in the top electrode at a total flow rate of 200 sccm (standard cubic centimeters per minute) and the pressure of this mixture was maintained at 100 miiliTorr with a mechanical vacuum pump and a throttle valve. A plasma 6 comprised of the undercomposed gas and of chemically reactive decomposition products such as molecular fragments and excited molecules and ions was created by applying a dc bias of 700 volts over the two electrodes that are present in the PECVD apparatus. The discharge was maintained for a period of 35 minutes at which time the voltage was disconnected, the gas flow was stopped and the vacuum system was brought back to atmospheric pressure. The paper edge guides were then removed from the vacuum system and inspected by microscopic techniques. It was found that these parts were nearly uniformly covered, one micron thickness, with a dark coating which was identified by standard analytical techniques as substantially diamond-like carbon with from 5 to 10 percent of hydrogen incorporated therein. It was further found that this coating was mechanically hard because it could not be scratched by traversing a stainless steel stylus over its surface while bearing down on the stylus with moderate force by hand. The thickness of the diamond-like coating was measured by cross sectional microscopic techniques and was determined to be one micron as indicated.

One of the aforementioned prepared coated paper registration guides was subsequently incorporated in the document handler of a Xerox Corporation 1065 TM xerographic apparatus and the document handler was rendered operative for a total of one million cycles. The paper guide was subsequently removed from the document handler for microscopic inspection. It was found that there were no detectable signs of mechanical wear as a result of the paper (Xerox Corporation 1040 TM paper ) sliding along this guide for 1,000,000 imaging cycles. This performance was compared to an uncoated steel Alliance registration edge paper guide in the above identical document handler (1065 TM) where it was found that a deep groove was worn in the steel guide after about 300,000 cycles of the paper passing through the document handler.

EXAMPLE II

An experimental plastic paper guide as obtained from Alliance Precision Plastics of Rochester, NY was coated with diamond-like carbon by repeating the procedure of Example I. The deposition was accomplished at room temperature, 25° C., that is the aformentioned paper guide part was not purposely heated before or during deposition. The coating film thickness was determined to be 200 nanometers thick and diamond-like carbon film adhesion to the plastic substrate was excellent. The diamond-like carbon coated plastic paper guide part was incorporated in the Xerox Corporation 1090 TM reprographic engine as a paper guide at the paper transfer location. This machine was subsequently operated for 500,000 cycles with 110 pound card stock paper. No mechanical wear was observable in the coating after this copy volume. This performance was compared to the performance of an uncoated plastic part in the identical location and it was found that a deep groove was worn in the plastic after about 100,000 cycles of the paper through the machine. This deep groove caused the skew and subsequent jamming of the paper when transported through this region in contact with the plastic paper guide. No machine jams were observed with the coated plastic paper guide.

EXAMPLE III

A Xerox Corporation 5090 TM paper guidance part, commonly referred to as a registration edge guide formed from sheet metal steel by a deep drawing process, was coated with titanium nitride as follows. The part was incorporated in a vacuum system commonly referred to as a CVD system. This apparatus was comprised of a tubular deposition chamber, which was contained in an oven where the temperature can be varied from 200° to 1,200° C. The deposition chamber was made of alumina and had an inner diameter of 6 inches. Gases were flowed through this chamber at atmospheric pressure at a total flow rate of 1 liter per minute. Titanium tetrachloride and nitrogen were introduced at a ratio of 1 to 25 for one hour at a temperature of 900° C. The part was removed from this sytem after coating and inspected by microscopic techniques as well as analyzed for composition by standard electron microscopic methods. It was found that the part was uniformly covered with a nearly stoichiometric coating of titanium nitride of about 500 nanometers in thickness. The coating was clearly visible on the part and yellow/-gold in color. The adhesion of the coating to the part was visually determined to be excellent in that no flaking or other form of detachment of the coating from the substrate could be observed.

The above coated part was subsequently incorported in the recirculating document handler of a Xerox Corporation 5090 TM machine and the document handler was operated for a total of five million cycles. The paper guide was subsequently removed from the document handler for microscopic inspection. It was found by visual inspection and microscopic techniques that there were no detectable signs of mechanical wear as a result of the paper sliding along this guide. This performance was compared to the performance of an uncoated registration edge guide steel part in the above identical document handler where it was found that a deep groove was worn in the steel after about 1 million cycles of the paper through the recirculating document handler.

EXAMPLE IV

A Xerox Corporation 5090 TM paper guidance part commonly referred to as a registration edge guide formed from sheet metal steel by a deep drawing process was coated with titanium carbide as follows. The part was incorporated in the same CVD system as described in Example III. Titanium tetrachloride and methane were flowed through this chamber at atmospheric pressure at a total flow rate of 1 liter per minute at a ratio of 1 to 1.5 for one hour at a temperature of 900° C. The part was removed from this system after coating and inspected by microscopic techniques as well as analyzed for composition by standard electron microscopic methods. It was found that the part was uniformly covered with a nearly stoichiometric coating of titanium nitride of about 350 nanometers in thickness. The adhesion of the coating to the part was determined to be excellent by visual observation.

The coated part was subsequently incorporated in the recirculating document handler of a Xerox Corporation 5090 TM machine and the document handler was operated for five million cycles. The coated paper guide part was subsequently removed from the document handler for microscopic inspection. It was found that there were no detectable signs of mechanical wear as a result of the paper sliding along this guide. This performance was compared to the performance of an uncoated paper guide steel part in the identical document handler where it was found that a deep groove is worn in the steel after about 1 million cycles of the paper passing through the recirculating document handler.

EXAMPLE V

The two hundred identical paper guidance components also known as paper registration edge guides of the Xerox Corporation 5090 TM revolving document handler were loaded in the CVD system of Example III and exposed to ammonia at atmospheric pressure at a temperature of 550° C. for a period of 6 hours. The components were deep drawn parts made from draw quality aluminum killed steel sheet of a thickness of 0.062 inch. After six hours, the flow of ammonia was terminated and the furnace was slowly cooled over a period of two hours to room temperature, upon which the parts were removed from the furnace. The titanium nitride coated parts were tested for surface hardness with a Rockwell hardness tester and the surface hardness was determined to be RC 84.

One of the two hundred of the surface hardened parts (RC 84) was subsequently incorporated in the recirculating document handler of a Xerox Corporation 5090 TM copy machine and the document handler was operated for a total of two million cycles. The paper edge guide was subsequently removed from the document handler for microscopic inspection. It was found that there were no detectable signs of mechanical wear as a result of the paper sliding along this hardened guide. This performance was compared to the performance of an untreated steel paper edge guide part in the identical document handler where it was found that a deep groove was worn in the steel after about 1 million cycles of the paper passing through the recirculating document handler.

EXAMPLE VI

Using the CVD system of Example III, two hundred identical paper guidance components also known as paper registration edge guides of the Xerox Corporation 5090 TM revolving document handler were loaded therein and exposed to a mixture of 50 percent acetylene and 50 percent methane at atmospheric pressure at a temperature of 700° C. for a period of 5 hours. The components were deep drawn parts made from draw quality aluminum kiln steel sheet of a thickness of 0.062 inch. After six hours the flow of gases was terminated and the furnace was slowly cooled over a period of two hours to room temperature, upon which the parts are removed from the furnace. The diamond-like coated parts were tested for surface hardness with a Rockwell hardness tester and the surface hardness was determined to be RC 86.

One of the above prepared surface hardened parts was subsequently incorporated in the recirculating document handler of a Xerox Corporation 5090 TM apparatus and the document handler was operated for a total of two million cycles. The paper edge guide was subsequently removed from the document handler for microscopic inspection. It was found that there were no detectable signs of mechanical wear as a result of the paper sliding along this hardened guide. This performance was compared to the performance of an untreated steel part in the identical document handler where it was found that a deep groove was worn in the steel after about 1 million cycles of the paper through the recirulating document handler. This deep groove causes undesirable performance in that the paper catches in the groove and obstructs the paper path thus jamming the document handler.

Other modifications of the present invention will occur to those skilled in the art subsequent to a review of the present application. These modifications, and equivalents thereof, are intended to be included within the scope of this invention.

What is claimed is:

1. A process for maximizing wear resistance of electrophotographic components which comprises coating the components with a titanium compound.

2. A process in accordance with claim 1 wherein the titanium compound is titanium nitride, or titanium carbide.

3. A process in accordance with claim 1 wherein the thickness of the coating is from 100 Angstroms to 100 microns in thickness.

4. A process in accordance with claim 1 wherein the coating is of a thickness of from about 10 nanometers to about 10 micrometers.

5. A process in accordance with claim 1 wherein the electrophotographic component is a paper guidance device.

6. A process for avoiding wear or maximizing abrasion resistance of paper guide components present in an electrophotographic apparatus which comprises coating the components with a titanium compound.

7. A process in accordance with claim 6 wherein the coating is of a thickness of from about 10 nanometers to about 10 micrometers.

8. A process in accordance with claim 6 wherein the electrophotographic component is a paper guidance device.

9. A process for avoiding wear or maximizing abrasion resistance of registration edge guides present in an electrophotographic apparatus which comprises coating the guides with a titanium compound.

10. A process in accordance with claim 9 wherein the thickness of the coating is from 100 Angstroms to 100 microns in thickness.

11. A process for avoiding wear or maximizing abrasion resistance of paper guide components present in an electrophotographic apparatus which comprises chemically modifying the surface of the component by nitriding or carbiding.

12. A process in accordance with claim 11 wherein the nitriding is accomplished with nitrogen or ammonia.

13. A process in accordance with claim 11 wherein the carbiding is accomplished with a carbon containing gas.

14. A process for improving wear resistance of electrophotographic components which comprises coating the components with a titanium compound.

* * * * *